(12) United States Patent
Castle et al.

(10) Patent No.: US 10,077,206 B2
(45) Date of Patent: Sep. 18, 2018

(54) METHODS OF ETCHING GLASS SUBSTRATES AND GLASS SUBSTRATES

(71) Applicant: CORNING INCORPORATED, Corning, NY (US)

(72) Inventors: Thomas Michael Castle, Horseheads, NY (US); Tian Huang, Painted Post, NY (US); Yuhui Jin, Painted Post, NY (US); Daniel Wayne Levesque, Jr., Bath, NY (US); Tammy Lynn Petriwsky, Elmira, NY (US)

(73) Assignee: Corning Incorporated, Corning, NY (US)

( * ) Notice: Subject to any disclaimer, the term of this patent is extended or adjusted under 35 U.S.C. 154(b) by 127 days.

(21) Appl. No.: 15/177,431

(22) Filed: Jun. 9, 2016

(65) Prior Publication Data

US 2016/0362331 A1 Dec. 15, 2016

Related U.S. Application Data

(60) Provisional application No. 62/173,607, filed on Jun. 10, 2015.

(51) Int. Cl.
*C03C 23/00* (2006.01)
*C03C 15/00* (2006.01)
(Continued)

(52) U.S. Cl.
CPC .......... *C03C 15/00* (2013.01); *B23K 26/0622* (2015.10); *B23K 26/382* (2015.10);
(Continued)

(58) Field of Classification Search
None
See application file for complete search history.

(56) References Cited

U.S. PATENT DOCUMENTS 5,985,700 A * 11/1999 Moore ................ H01L 27/1214
257/E27.111
6,143,382 A * 11/2000 Koyama ................ C03C 4/0071
216/11
(Continued)

FOREIGN PATENT DOCUMENTS

CN 103522031 A * 1/2014
EP 2762264 8/2014
(Continued)

OTHER PUBLICATIONS

Machine Translation of JP 4702794 B2, Jun. 2011 (Year: 2011).*
(Continued)

*Primary Examiner* — Jeffrey A Vonch
(74) *Attorney, Agent, or Firm* — John P. McGroarty; John T. Haran (57) ABSTRACT

A method of forming a glass substrate includes providing a glass substrate having alumina, translating a pulsed laser beam on the glass substrate to form one or more pilot holes, contacting the glass substrate with an etching solution, and providing agitation. The etching solution has a pH from about 0 to about 2.0, and an etch rate is less than about 3 $\mu$m/min. A glass substrate is disclosed having a first surface and a second surface opposite the first surface in a thickness direction, and at least one hole penetrating the first surface, wherein the at least one hole has been etched by an etching solution. A greatest distance d1 between (1) a first plane that contacts the first surface in regions that do not have the at least one hole or a deviation in a thickness of the substrate surrounding the at least one hole and (2) a surface of the deviation recessed from the first plane is less than or equal to about 0.2 $\mu$m.

15 Claims, 8 Drawing Sheets

(51) Int. Cl.
*B23K 26/382* (2014.01)
*B23K 26/40* (2014.01)
*B23K 26/0622* (2014.01)
*B23K 26/384* (2014.01)
B23K 103/00 (2006.01)
C03C 4/00 (2006.01)
B23K 101/40 (2006.01)
H01L 21/48 (2006.01)
H01L 23/15 (2006.01)

(52) U.S. Cl.
CPC ............ *B23K 26/384* (2015.10); *B23K 26/40* (2013.01); *C03C 23/0025* (2013.01); *B23K 2201/40* (2013.01); *B23K 2203/50* (2015.10); *B23K 2203/54* (2015.10); *C03C 4/0071* (2013.01); *H01L 21/4807* (2013.01); *H01L 23/15* (2013.01); *Y10T 428/24182* (2015.01); *Y10T 428/24273* (2015.01); *Y10T 428/24479* (2015.01); *Y10T 428/24777* (2015.01)

(56) References Cited

U.S. PATENT DOCUMENTS

| | | | | |
|---|---|---|---|---|
| 6,194,365 | B1* | 2/2001 | Lee | C03C 15/00 134/2 |
| 6,230,720 | B1* | 5/2001 | Yalamanchili | H01L 21/02052 134/1.3 |
| 6,262,389 | B1* | 7/2001 | Koyama | C03C 4/06 204/192.2 |
| 6,320,158 | B1* | 11/2001 | Kitajima | B23K 26/10 219/121.7 |
| 6,576,150 | B1* | 6/2003 | Weigert | C03C 15/00 216/24 |
| 9,278,886 | B2 | 3/2016 | Boek et al. | |
| 9,296,646 | B2 | 3/2016 | Burket et al. | |
| 9,321,680 | B2 | 4/2016 | Chuang et al. | |
| 2003/0007772 | A1 | 1/2003 | Borrelli et al. | |
| 2003/0031878 | A1* | 2/2003 | Mitani | C03C 3/083 428/426 |
| 2003/0150839 | A1 | 8/2003 | Kobayashi et al. | |
| 2003/0217568 | A1* | 11/2003 | Koyo | B23K 26/073 65/105 |
| 2003/0235385 | A1* | 12/2003 | Taylor | G02B 6/13 385/129 |
| 2004/0092105 | A1 | 5/2004 | Lee et al. | |
| 2004/0126538 | A1* | 7/2004 | Corcoran | B26F 1/24 428/131 |
| 2005/0025445 | A1* | 2/2005 | Schoroeder | B23K 26/0648 385/137 |
| 2005/0095404 | A1* | 5/2005 | Schillert | C03B 11/07 428/178 |
| 2006/0049156 | A1* | 3/2006 | Mulloy | B23K 26/123 219/121.71 |
| 2006/0207976 | A1* | 9/2006 | Bovatsek | C03B 33/0222 219/121.69 |
| 2009/0013724 | A1 | 1/2009 | Koyo et al. | |
| 2009/0136711 | A1* | 5/2009 | Tomino | C09J 7/20 428/137 |
| 2009/0162606 | A1* | 6/2009 | Hsu | B28D 1/00 428/131 |
| 2010/0062214 | A1* | 3/2010 | Wo | B23K 26/0619 428/131 |
| 2010/0147813 | A1* | 6/2010 | Lei | C03B 33/082 219/121.72 |
| 2010/0159191 | A1* | 6/2010 | Imai | H01L 21/6836 428/131 |
| 2010/0304061 | A1* | 12/2010 | Ye | H01L 21/31116 428/34.4 |
| 2011/0111179 | A1* | 5/2011 | Blick | B23K 26/18 428/172 |
| 2011/0229687 | A1* | 9/2011 | Gu | H01L 21/486 428/131 |
| 2011/0256344 | A1* | 10/2011 | Ono | C03C 3/076 428/131 |
| 2012/0131958 | A1 | 5/2012 | Shimoi et al. | |
| 2012/0196071 | A1 | 8/2012 | Cornejo et al. | |
| 2013/0012104 | A1* | 1/2013 | Yamaguchi | C03C 23/0075 451/41 |
| 2013/0017363 | A1* | 1/2013 | Morioka | C09J 7/0267 428/138 |
| 2013/0040100 | A1* | 2/2013 | Morioka | B32B 3/10 428/138 |
| 2013/0089701 | A1 | 4/2013 | Hooper et al. | |
| 2013/0209731 | A1* | 8/2013 | Nattermann | B23K 26/0093 428/131 |
| 2013/0247615 | A1 | 9/2013 | Boek et al. | |
| 2013/0330506 | A1* | 12/2013 | Schmidt | B26F 1/28 428/131 |
| 2014/0116091 | A1 | 5/2014 | Chuang et al. | |
| 2014/0147623 | A1 | 5/2014 | Shorey et al. | |
| 2014/0147624 | A1 | 5/2014 | Streltsov et al. | |
| 2014/0318578 | A1* | 10/2014 | Enicks | C03C 23/0075 134/15 |
| 2015/0027757 | A1* | 1/2015 | Shin | H05K 3/107 174/255 |
| 2015/0060402 | A1 | 3/2015 | Burkett et al. | |
| 2015/0166395 | A1 | 6/2015 | Marjanovic et al. | |
| 2015/0166396 | A1 | 6/2015 | Marjanovic et al. | |
| 2015/0173191 | A1* | 6/2015 | Takahashi | H05K 3/0029 174/255 |
| 2015/0228569 | A1* | 8/2015 | Wang | H01L 21/4853 361/771 |
| 2015/0261261 | A1 | 9/2015 | Bhagavatula et al. | |
| 2015/0279756 | A1* | 10/2015 | Erlesand | H01L 23/49827 257/415 |
| 2016/0035587 | A1 | 2/2016 | Keech et al. | |
| 2016/0059359 | A1* | 3/2016 | Krueger | B23K 26/0057 65/29.1 |
| 2016/0102009 | A1 | 4/2016 | Boek et al. | |

FOREIGN PATENT DOCUMENTS

| | | | | |
|---|---|---|---|---|
| JP | 63040734 | A * | 2/1988 | |
| JP | 08141765 | A * | 6/1996 | ......... C03C 23/0025 |
| JP | 11177200 | A * | 7/1999 | |
| JP | 2000302488 | A * | 10/2000 | ............ C03C 19/00 |
| JP | 2001098298 | A * | 4/2001 | |
| JP | 2002028799 | A * | 1/2002 | ............ C03B 23/02 |
| JP | 2004351494 | A * | 12/2004 | ........ B23K 26/0057 |
| JP | 2006290630 | | 10/2006 | |
| JP | 2007136642 | A * | 6/2007 | |
| JP | 2008094641 | A * | 4/2008 | |
| JP | 2008119698 | A * | 5/2008 | |
| JP | 2008120638 | A * | 5/2008 | |
| JP | 2008156200 | | 7/2008 | |
| JP | 2008266036 | A * | 11/2008 | |
| JP | 2010070416 | A * | 4/2010 | |
| JP | 4702794 | B2 * | 6/2011 | ............. C03C 4/04 |
| JP | 2011140441 | A * | 7/2011 | |
| JP | 2011143434 | A * | 7/2011 | |
| JP | 2011178642 | | 9/2011 | |
| JP | 2011178642 | A * | 9/2011 | |
| JP | 2013147404 | A * | 8/2013 | |
| SE | 530841 | C2 * | 9/2008 | |
| WO | WO-2005033033 | A1 * | 4/2005 | ............. C03C 4/04 |
| WO | WO-2009022428 | A1 * | 4/2010 | ............ C03C 15/00 |
| WO | WO-2014154342 | A2 * | 10/2014 | ........ C03C 23/0025 |
| WO | 2015138670 | | 9/2015 | |

OTHER PUBLICATIONS

Machine Translation of JP 2007136642 A, Jun. 2007 (Year: 2007).*
Machine Translation of JP 2008094641 A, Apr. 2008 (Year: 2008).*
Lee et al., Dielectric Breakdown of Thinned BaO-Al2O3-B2O3-SiO2 Glass, Apr. 2010, Journal of the American Ceramic Society, vol. 93, Issue 8, pp. 2346-2351 (Year: 2010).*
Bocko, Glass for Advanced Semiconductor Applications: Myths and Opportunities, Nov. 2011 (Year: 2011).*

(56) References Cited

OTHER PUBLICATIONS

Corning et al., Semiconductor Glass Products Product Information Sheet, Jan. 2015 (Year: 2015).*
Kolasinski, Kurt W. "The Composition of Fluoride Solutions", Journal of the Electrochemical Society, 152 (9) J99-J104 (2005), 6 pages.
Invitation to Pay Additional Fees; PCT/US2016/036566; dated Sep. 13, 2016; 6 Pages; European Patent Office.
International Search Report and Written Opinion of the International Searching Authority; PCT/US2016/036566; dated Nov. 30, 2016; 18 Pages; European Patent Office.

* cited by examiner

METHODS OF ETCHING GLASS SUBSTRATES AND GLASS SUBSTRATES

This application claims the benefit of priority under 35 U.S.C. § 119 of U.S. Provisional Application Ser. No. 62/173,607 filed on Jun. 10, 2015 the content of which is relied upon and incorporated herein by reference in its entirety.

BACKGROUND

The present specification generally relates to etching solutions for treating glass substrates and, more particularly, to etching solutions for treating glass substrates fabricated by creating pilot holes.

TECHNICAL BACKGROUND

Glass substrates are used in a variety of industries, including the electronics industry where glass is used to cover displays devices. Examples of such display devices include Liquid Crystal Displays and Light Emitting Diode displays, for example, computer monitors, televisions, and handheld devices. Glass substrates, particularly with through-holes, are also used as interposers and RF devices in semiconductors. However, meeting dimensional tolerances is challenging because the glass may deform during forming, annealing, and chemical strengthening. Additionally, traditional computer numerical control ("CNC") machining methods used to create through-features, such as holes may cause non-uniform heating during glass reforming that may lead to waviness of the surface of the glass substrate and undesired deformation. Etching a glass substrate having through-features with a chemical etching solution can further exacerbate the waviness and depressions in the surface of the glass substrate.

SUMMARY

According to a first aspect, a method of forming a glass substrate with at least one through-feature includes translating a pulsed laser beam on the glass substrate to form one or more pilot holes, wherein the glass substrate comprises alumina; contacting the glass substrate with an etching solution; and agitating either one of the glass substrate or the etching solution or both during the contacting of the glass substrate and the etching solution to enlarge a diameter of the one or more pilot holes to form at least one through-feature. The etching solution has a pH from about 0 to about 2.0, and an etch rate is less than about 3 µm/min.

In a second aspect, according to the first aspect the contacting of the glass substrate with the etching solution comprises submerging the glass substrate into a bath of etching solution.

In a third aspect according to the second aspect, wherein the agitation is ultrasonic agitation provided to the bath of etching solution.

In a fourth aspect according to the third aspect, wherein the ultrasonic agitation has a frequency between about 40 kHz and about 192 kHz.

In a fifth aspect according to any one of the first through fourth aspects, wherein a greatest distance d1 between (1) a first plane that contacts the first surface in regions that do not have the at least one through-feature or a deviation in a thickness of the substrate surrounding the at least one through-feature and (2) a surface of the deviation recessed from the first plane is less than or equal to about 0.2 µm.

In a sixth aspect according to any one of the first through fifth aspects, wherein the etching solution comprises a weak acid selected from the group consisting of acetic acid, oxalic acid, carbonic acid, citric acid, and phosphoric acid.

In a seventh aspect according to any one of the first through sixth aspects, wherein the etching solution comprises a buffer selected from salts of acetic acid, salts of oxalic acid, salts of carbonic acid, salts of phosphoric acid, and salts of citric acid.

In an eighth aspect according to any of one of the first through seventh aspects, the etching solution comprises a buffer selected from the group consisting of ammonium fluoride, potassium fluoride, and sodium fluoride.

In a ninth aspect according to any one of the first through eighth aspects, wherein the pH of the etching solution is from about 1.3 to about 1.7.

In a tenth aspect according to any one of the first through ninth aspects, wherein the etch rate is less than about 2.5 µm/min.

In an eleventh aspect according to any one of the first through tenth aspects, wherein a temperature of the etching solution is from about 10° C. to about 30° C.

In a twelfth aspect according to any one of the first through eleventh aspects, wherein at least one 2 µm by 2 µm region of the first surface without the through-feature or a deviation in a thickness of the substrate surrounding the at least one through-feature has an average surface roughness $R_a$ less than about 0.9 nm.

In a thirteenth aspect according to the twelfth aspect, wherein a greatest distance d between (1) a first plane that contacts the first surface in regions that do not have the at least one through-feature or the deviation in a thickness of the substrate surrounding the at least one through-feature and (2) a surface of the deviation recessed from the first plane is less than or equal to about 0.2 µm.

In a fourteenth aspect according to the twelfth or thirteenth aspects, wherein at least five 2 µm by 2 µm regions of the first surface without the through-feature or a deviation in a thickness of the substrate surrounding the at least one through-feature has an average surface roughness $R_a$ less than about 0.9 nm.

In a fifteenth aspect according to any one of the twelfth through fourteenth aspects, wherein the etching solution comprises a weak acid selected from the group consisting of acetic acid, oxalic acid, carbonic acid, citric acid, and phosphoric acid.

In a sixteenth aspect according to the fifteenth aspect, wherein the etching solution comprises a buffer selected from the group consisting of ammonium fluoride, potassium fluoride, and sodium fluoride.

In a seventeenth aspect, a method of forming a glass substrate with at least one through-feature includes translating a pulsed laser beam on the glass substrate to form one or more pilot holes, wherein the glass substrate does not comprise alumina, phosphate, and phosphorus pentoxide; contacting the glass substrate with an etching solution; and agitating either one of the glass substrate or the etching solution or both during the contacting of the glass substrate and the etching solution to enlarge a diameter of the one or more pilot holes to form at least one through-feature. The etch rate is less than about 3 µm/min.

In an eighteenth aspect according to the seventeenth aspect, wherein the contacting of the glass substrate with the etching solution comprises submerging the glass substrate into a bath of etching solution.

In a nineteenth aspect according to the seventeenth or eighteenth aspect, wherein the agitation is ultrasonic agitation provided to the bath of etching solution.

In a twentieth aspect according to the nineteenth aspect, wherein the ultrasonic agitation has a frequency between about 40 kHz and about 192 kHz.

In a twenty-first aspect according to any one of the seventeenth through twentieth aspects, a greatest distance d1 between (1) a first plane that contacts the first surface in regions that do not have the at least one through-feature or a deviation in a thickness of the substrate surrounding the at least one through-feature and (2) a surface of the deviation recessed from the first plane is less than or equal to about 0.2 μm.

In a twenty-second aspect according to any one of the seventeenth through twenty-first aspects, wherein the etch rate is less than about 2.5 μm/min.

In a twenty-third aspect, a glass substrate is disclosed having a first surface and a second surface opposite the first surface in a thickness direction, and at least one hole penetrating at the first surface. The at least one hole has been etched by an etching solution, and a greatest distance d1 between (1) a first plane that contacts the first surface in regions that do not have the at least one hole or a deviation in a thickness of the substrate surrounding the at least one hole and (2) a surface of the deviation recessed from the first plane is less than or equal to about 0.2 μm.

In a twenty-fourth aspect according to the twenty-third aspect, wherein the at least one hole is a through-feature that penetrates the first surface and the second surface, and the first surface and the second surface have been etched by an etching solution.

In a twenty-fifth aspect according to the twenty-third aspect or the twenty-fourth aspect, wherein the greatest distance d1 is less than or equal to about 0.15 μm.

In a twenty-sixth aspect according to any of the twenty-third through twenty-fifth aspects, wherein at least one 2 μm by 2 μm region of the first surface without the through-feature or the deviation in a thickness of the substrate surrounding the at least one through-feature has an average surface roughness $R_a$ less than about 0.9 nm.

In a twenty-seventh aspect according to any one of the twenty-third through twenty-sixth aspects, wherein at least five 2 μm by 2 μm regions of the first surface without the through-feature or the deviation in a thickness of the substrate surrounding the at least one through-feature has an average surface roughness $R_a$ less than about 0.9 nm.

In a twenty-eighth aspect according to any one of the twenty-third through twenty-seventh aspects, wherein the at least one hole is a through-feature that penetrates the first surface and the second surface; and a greatest distance d2 between (1) a second plane that contacts the second surface in regions that do not have the at least one hole or a deviation in a thickness of the substrate surrounding the at least one hole and (2) a surface of the deviation recessed from the first plane is less than or equal to about 0.2 μm.

In a twenty-ninth aspect according to any one of the twenty-third through twenty-seventh aspects, wherein at least one 2 μm by 2 μm region of the first surface without the through-feature or the deviation in a thickness of the substrate surrounding the at least one through-feature has an average surface roughness $R_a$ less than about 0.9 nm.

In a thirtieth aspect, a semiconductor device is disclosed having the glass substrate of any one of the twenty-third through twenty-ninth aspects.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 5A-F are images showing depths of depressions around through-features in glass substrates using a high-pH etching solution and a low-pH etching solution according to one or more embodiments described and illustrated herein.

The Figures are not drawn to scale.

DETAILED DESCRIPTION

Reference will now be made in detail to embodiments of methods for etching glass substrates after pilot holes are formed in the glass substrate, and etching solutions used in such methods. Although embodiments disclosed herein are directed to etching a glass substrate where through-features are formed using lasers, it should be understood that the through-features may be formed by other methods, such as CNC machining, drilling, and the like.

Generally, pilot holes may be formed by lasers at arbitrary locations on the glass substrate. The glass substrate is then subjected to an etching solution to create through-features within the glass substrate. In some embodiments, the glass substrate having through-features formed therein may then be subjected to a strengthening process, such as an ion-exchange strengthening process.

The glass initially may be a flat glass substrate formed of any glass composition, including but not limited to borosilicate glasses, aluminosilicate glasses, aluminoborosilicate glasses, soda lime glasses, alkali-containing glasses and alkali-free glasses.

In some embodiments, the glasses described hereinabove are down-drawable by processes known in the art, such as slot-drawing, fusion drawing, re-drawing, and the like, and has a liquidus viscosity of at least 130 kilopoise.

Figure 1:
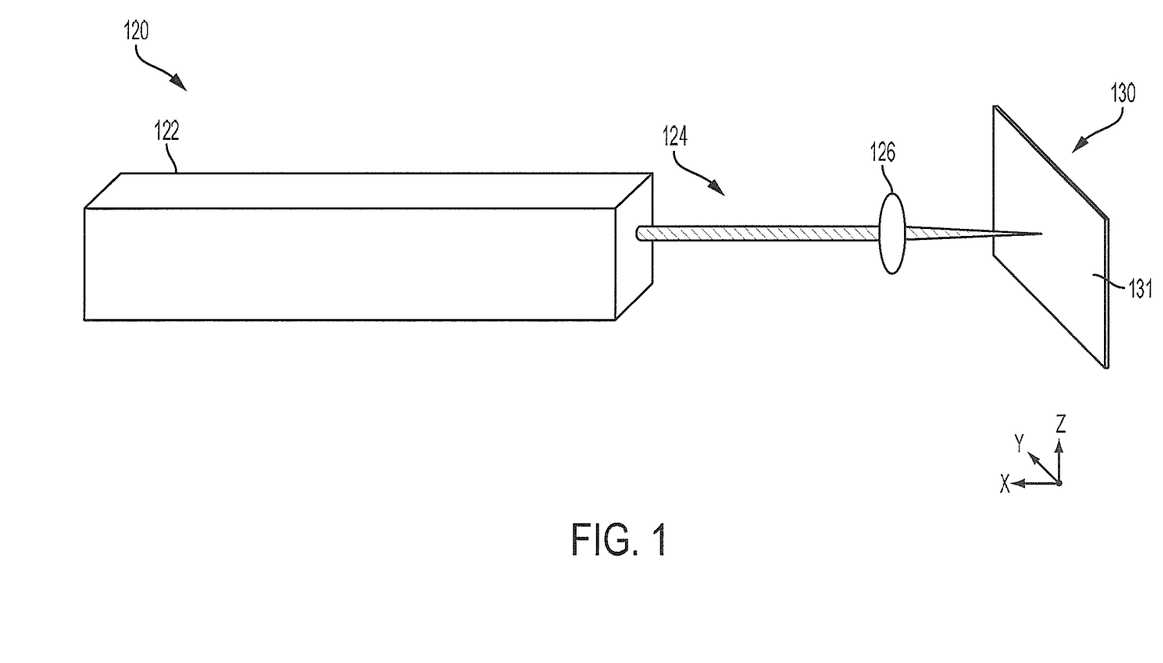
FIG. 1 schematically depicts a laser system for generating pilot holes within a flat glass substrate according to one or more embodiments described and illustrated herein.

Referring initially to FIG. 1, a system 120 for forming pilot holes into a flat glass substrate 130 is schematically depicted. A laser source 122 is provided that is operable to generate a pulsed laser beam 124 that is focused by coupling optics 126 and directed toward the flat glass substrate 130. The laser source 122 may be any laser source capable of forming pilot holes in the glass substrate. As an example and not a limitation, the laser source 122 generates a pulsed laser beam 124 (e.g., about 266 nm, about 355 nm, about 532 nm, or about 1064 nm in wavelength) that is operated in picosecond or nanosecond pulses. In some embodiments, pilot holes may be induced into regions of the flat glass substrate The coupling optics 126 may be configured as one or more lenses that focus the pulsed laser beam 124 into a focused laser beam having a focal point at a desired location with respect to the flat glass substrate 130. As described in more detail below, in some embodiments, the focus of the coupling optics 126 may be controllable to percussion drilling as described in U.S. Patent Application Publication Nos. 2014/0116091; 2013/0247615; 2014/0147623; and 2015/0166395 all of which are incorporated herein by reference in their entireties.

The pulsed laser beam 124 may be configured to be scanned on the flat glass substrate 130 to form the desired pilot hole. In some embodiments, the flat glass substrate 130 may be coupled to a computer-controlled XYZ stage (not shown) such that the flat glass substrate is translated with respect to the pulsed laser beam 124. Additionally, a beam splitter (not shown) may also be provided to split a single laser beam 124 generated by the laser source 122 into a plurality of laser beams for simultaneously forming a plurality of pilot holes within the flat glass substrate 130.

In embodiments, a method of laser drilling a material includes focusing a pulsed laser beam into a laser beam focal line oriented along the beam propagation direction and directed into the material, the laser beam having an average laser burst energy measured at the material greater than about 50 microJoules per mm thickness of material being processed, having burst energy density in a range from about 25 μJ/mm of line focus to about 125 μJ/mm of line focus, having pulses having a duration less than about 100 picoseconds, and a repetition rate in a range of between about 1 kHz and about 4 MHz. The length of the line focus can be determined by the distance between the two points on the optical axis where the intensity is one half the maximum intensity. The laser beam focal line generates an induced absorption within the material, the induced absorption producing a hole along the laser beam focal line within the material.

Once the pilot holes are formed in the glass substrate, such as by a laser as disclosed hereinabove, the geometries of the pilot holes may be modified by subjecting the glass substrate to an etching process. For example, in embodiments, the through-features may be through-holes having an initial diameter from laser percussion drilling the glass substrate. However, when the glass substrate comprising a through-hole is subjected to an etching process, the diameter of the through-holes may be increased, and a difference between the diameter of the through-hole at one surface of the of the glass substrate and the diameter of the through-hole at a second surface of the glass substrate may be decreased (i.e., the through-hole has a more constant diameter through the thickness of the glass substrate).

Figure 2:
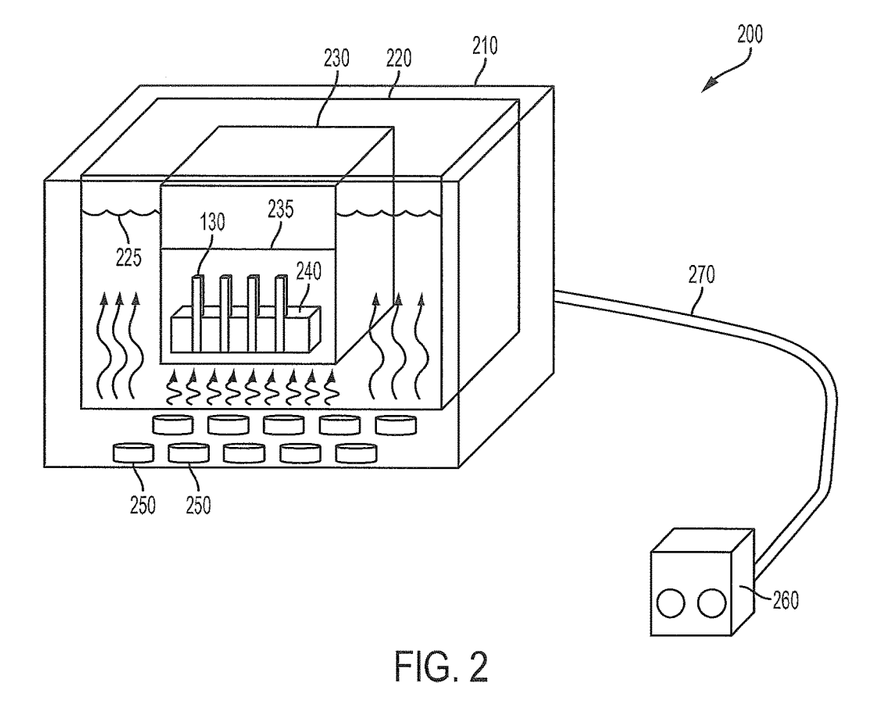
FIG. 2 schematically depicts a glass substrate etching apparatus according to one or more embodiments described and illustrated herein.

Referring now to FIG. 2, an exemplary etching apparatus 200 for etching the glass substrate 130 to open the laser drilled holes (also referred to herein as "pilot holes") is schematically depicted. Generally, the example etching apparatus 200 includes an outer container 210, a water tank 220, an etching solution tank 230, a sample holder 240, ultrasonic transducers 250, and an ultrasonic generator 260. In the illustrated embodiment, the etching solution tank 230 is disposed within the water tank 220 and the water tank 220 is disposed within the outer container 210. The ultrasonic transducers 250 may be disposed within the outer container 210 and interface with the water tank 220, such that ultrasonic energy may be imparted to water 225 contained within the water tank 220, which is then imparted to the etching solution 235 contained within the etching solution tank 230, and ultimately imparted to the glass substrate 130 supported by the sample holder 240 in the etching solution tank 230. It should be understood that the ultrasonic transducers 250 may be configured in any position and orientation relative to the water tank 220, such as below the water tank 220 and/or on the side of the water tank 220. The ultrasonic energy applied to the glass substrate 130 while being etched by the etching solution 235 in the etching solution tank 230 enhances the etching of the glass substrate 130 and facilitates the formation of through-features with desirable characteristics, as will be described in further detail below.

In the embodiment depicted in FIG. 2, the sample holder 240 is fabricated such that the glass substrate 130 is supported in a vertical orientation. Not wishing to be bound by theory, when the sample holder 240 supports the glass substrate 130 in a vertical orientation, several glass substrates may be processed simultaneously and the ingression and egression of the etchant through the through-features may be facilitated by the sinusoidal nature of the ultrasonic sound waves as they traverse the surface of the substrates while simultaneously enabling acoustic cavitation. In other embodiments, the sample holder 240 may be fabricated such that the glass substrate 130 is supported in a horizontal orientation in which the ultrasonic sound waves may travel directly or longitudinally through the through-features. Not wishing to be bound by theory, when the glass substrate 130 is supported in a horizontal orientation, the ingression and egression of the etchant through the through-features may be accomplished by both gravity and the traversal of the acoustic waves longitudinally through the through-features. When the glass substrate 130 is supported in the horizontal orientation, it may be advantageous to process one glass substrate 130 at a time to avoid acoustic attenuation that may result from ultrasonic sound waves traveling from substrate to substrate.

The water tank 220 includes water 225 filled to a level sufficient to ensure that ultrasonic energy produced by the ultrasonic transducers 250 is transferred to the glass substrate 130 immersed within the etching solution tank 230. In some embodiments, water 225 is deionized water, which may include a few millimeters of detergent to reduce surface tension. However, it should be understood that in other embodiments water 225 may be a type of water other than deionized water and/or may not include detergent. Furthermore, it should be understood that a liquid other than water may be utilized to transfer the ultrasonic energy from the ultrasonic transducers 250 to the etching solution 235 within the etching solution tank 230. Some embodiments may not include the water tank 220, such as in embodiments in which the ultrasonic transducers directly agitate the etching solution 235 in the etching solution tank 230.

The ultrasonic generator 260 is electrically connected to the ultrasonic transducers 250 through-feature an electrical cable 270. The ultrasonic generator 260 causes the ultrasonic transducers 250 to produce ultrasonic energy at one or more frequencies. The ultrasonic transducers 250 may produce ultrasonic energy at a variety of frequencies. In some embodiments, the ultrasonic energy has a frequency between about 40 kHz and about 192 kHz. In some embodiments, the ultrasonic energy has a frequency between about 80 kHz and about 132 kHz. In some embodiments, the ultrasonic energy is centered about a primary frequency and dithered or swept above and below the primary frequency, such as when ultrasonic energy is centered about 80 kHz and swept back and forth between about 79 kHz and about 81 kHz (i.e., 80 kHz+/−1 kHz). In other embodiments, the ultrasonic energy may be centered about a different frequency and/or dithered or swept in a range greater than 1 kHz above and below the primary frequency. In some embodiments, the ultrasonic energy has a first frequency and a second frequency, such as when the ultrasonic transducers 250 produce ultrasonic energy having at least two frequencies. For example, a first ultrasonic transducer may produce ultrasonic energy having a first frequency and a second ultrasonic transducer may simultaneously produce ultrasonic energy having a second frequency. In some embodiments, the ultrasonic transducers 250 may produce the ultrasonic energy in a "40 kHz/80 kHz cross-fired" configuration in which the first frequency is 40 kHz and the second frequency is 80 kHz. In some embodiments, the ultrasonic transducers 250 may produce the ultrasonic energy in an "80 kHz/120 kHz cross-fired" configuration in which the first frequency is 80 kHz and the second frequency is 120 kHz.

Although embodiments provided hereinabove describe submerging the glass substrate into an etching solution, it should be understood that the etching solution may be contacted with the glass substrate by other methods, such as spraying the glass substrate with the etching solution using oscillating spraying heads. In such an embodiment, the oscillating spray heads provide agitation by moving the spray of the etching solution. The velocity of the oscillation and the velocity of the spray may be adjusted to vary the agitation.

Further, in embodiments, agitation of the etching solution may be 3-D agitation, such as by moving a bath of etching solution while the glass substrate is submerged in the bath. Such 3-D movement may be conducted, for example, by moving the glass substrates comprising pilot holes in the x-direction, y-direction, and the z-direction. In some embodiments, the glass substrates comprising pilot holes may be moved in the etching solution following a spiral track. In embodiments, glass substrates with a thickness less than about 300 μm are agitated by 3-D agitation and glass substrates with a thickness greater than about 300 μm are agitated by ultrasonic agitation. In other embodiments, glass substrates having any thickness may be agitated by ultrasonic agitation or megasonic agitation. In some embodiments, the agitation may include moving either one of the glass substrate or the etching solution or both.

In laser damage and etching processes, such as described above, agitation is generally used during the etching process to help transport the etchant into the pilot holes and remove the dissolute glass from the pilot holes. However, often times, the agitation is not uniform and thereby promotes differential etching around the through-feature and at surfaces adjacent to the through-feature. In some laser damage and etching processes ultrasonic vibrations or megasonic vibrations are used as the agitations. However, the ultrasonic and megasonic vibrations are often times distributed unevenly, thereby causing areas with more exposure to the ultrasonic and megasonic vibrations to have more dissolution of the glass than areas with less exposure to ultrasonic and megasonic vibrations. This uneven distribution of ultrasonic and megasonic vibrations causes the glass substrate to have undesired surface waviness. Accordingly, in embodiments disclosed herein, an etching solution for etching glass substrates that is not sensitive to agitation is disclosed.

Figure 3:
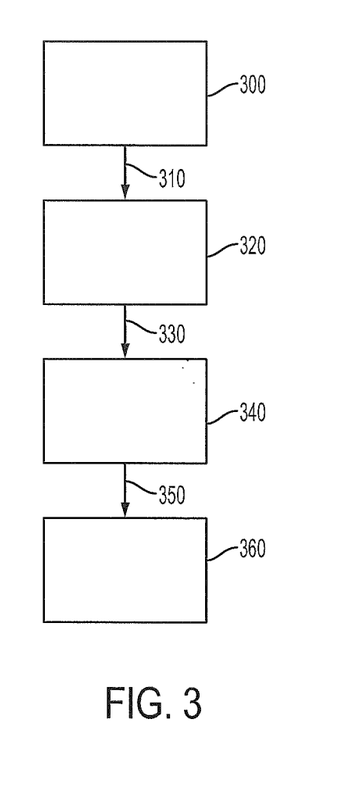
FIG. 3 is a flow chart of an etching process according to one or more embodiments described and illustrated herein.

Although not being bound to any particular theory, it is believed that the etching process is a three-step interface reaction that occurs at the liquid-solid interface between the etching solution and the glass substrate. With reference to FIG. 3, at the first block 300 the etchant is in the bulk etching solution. In the first step in the etching process 310 the reactant (also referred to herein as the "etchant") diffuses from the bulk of the etching solution to the glass surface. At the second block 320 the etchant is at the glass surface. In the second step 330 of the etching process the etchant that diffused from the bulk of the etching solution reacts with the glass surface. At the third block 340 a dissolute glass byproduct formed from the reaction step is present at the glass surface. In the third step 350 the dissolute glass byproduct is diffused from the surface of the glass article to the bulk of the etching solution. At the fourth block 360, the dissolute glass byproduct is in the bulk of the etching solution.

With reference again to FIG. 3, when the dissolute glass byproduct generation is slow, such as when an etching rate is low, the first step 310 and second step 330 of the etching process (i.e., the first diffusion step and the reaction step) determine the rate of the etching process. As an example, etching aluminosilicate glass with hydrofluoric acid (HF) includes two primary chemical reactions; the dissolution of silicate (shown in Reaction 1 below) and the dissolution of alumina (also referred to as aluminum oxide or $Al_2O_3$) (shown in Reaction 2 below).

$$SiO_2 \text{ (glass)} + 6HF \text{ (sol.)} \rightarrow H_2SiF_6 \text{ (sol.)} + H_2O \text{ (sol.)} \qquad 1$$

$$Al_2O_3 \text{ (glass)} + 6H^+ \text{ (sol.)} \rightarrow 2Al^{3+} \text{ (sol.)} + 3H_2O \text{ (sol.)} \qquad 2$$

The dissolution of silicate in Reaction 1 is a relatively slow reaction, while the dissolution of alumina in Reaction 2 is a relatively fast reaction, particularly when the etching solution has a high proton concentration (i.e., low pH). Thus, at high proton concentrations, the overall etching of aluminosilicate glass is limited by the first diffusion step, meaning that the etching of glass substrate is limited by the amount of etchant that can be diffused from the bulk of the etching solution to the surface of the glass substrate. Thus, the etching process for aluminosilicate glass in low pH (high proton concentration) etching solutions is sensitive to agitation because the agitation increases the diffusion rate of the etchant from the bulk of the etching solution to the surface of the glass substrate by moving the etching solution and re-introducing the etchant to the surface of the glass substrate. Accordingly, in the above-described aluminosilicate etching process, areas that receive more exposure to agitation will undergo more etching because the diffusion of etchant to the surface of the glass substrate (the limiting step of the etching process) is increased at those areas that receive more exposure to agitation. Thus, if agitation is not uniform in such an etching process waviness in the glass substrate may occur, and depressions may be formed around the pilot hole.

Laser damage and etching processes generally use an etching solution comprising HF and a second, strong acid—such as sulfuric acid, nitric acid, and hydrochloric acid. It is generally thought that the inclusion of the second, strong acid is beneficial to increase the etching rate. However, the second, strong acid increases the available protons in the etching solution and lowers the pH of the etching solution. Therefore, the etching solutions generally used in laser damage and etching have high proton concentrations and are subject to the waviness and depressions described above.

As described hereinabove, when an etching solution having a high proton concentration is used to etch an aluminosilicate glass substrate in combination with agitation, a wavy surface may result and depressions may form around the through-features. These defects occur because diffusion of the etchant to the glass surface is the limiting step of the etching process. Accordingly, in embodiments, an etching solution is formulated that shifts the limiting step of the etching process from the first diffusion step to the reaction step. By making this transition, the etching of the glass substrate is not limited by the amount of etchant that is diffused to the surface of the glass substrate.

In embodiments, the limiting step of the etching process may be shifted from the first diffusion step to the reaction step by increasing the pH of the etching solution. An etching solution with a higher pH has less free protons to react with the alumina in the glass substrate, thus lowering the rate of Reaction 2 and causing the reaction step (e.g., Reaction 1 and Reaction 2) to become the limiting step of the etching process. As discussed above, agitation is primarily used to increase the amount of etchant that is delivered to the surface of the glass substrate, which can cause non-uniform etching when the first diffusion step is the limiting step of the etching process. However, when the first diffusion step is not the limiting step of the etching process, agitation does not have a strong effect on the morphology of the glass surface because the etching process is limited by the rate of the reaction step and not by the amount of etchant diffused to the surface of the glass substrate.

Embodiments of the etching solution disclosed herein have a pH from about 0 to about 2.0, from about 0.5 to about 2.0, from about 1.0 to about 2.0, or from about 1.2 to about 1.8. In other embodiments, the etching solution has a pH from about 1.3 to about 1.7, such as from about 1.4 to about 1.6. In yet other embodiments, the etching solution has a pH of about 1.5. As discussed above, using an etching solution with a relatively high pH lowers the proton concentration in the etching solution and shifts the limiting step of the etching process from the first diffusion step to the reaction step and reduces the sensitivity of the glass to agitation.

In embodiments, the pH of the etching solution is increased by eliminating the second, strong acid that is generally used in combination with HF in etching solutions. For example, in etching solutions generally used in laser damage and etching processes, nitric acid ($HNO_3$) is used with HF. Using 2.4M $HNO_3$ in an etching solution with HF yields an etching solution with a pH of about −0.4 in the etching solution. However, using pure 3M HF yields an etching solution with a pH of about 1.4. Accordingly, removing the second, strong acid from the etching solution significantly raises the pH of the etching solution. To maintain a relatively high pH without using pure HF, a weak acid may replace the second, strong acid. Exemplary weak acids include acetic acid, oxalic acid, carbonic acid, citric acid, and phosphoric acid.

The pH of the etching solution can be further increased by including a buffer in the etching solution. In embodiments, the buffer may be a fluoride salt. Exemplary fluoride salts that may be used as buffers include ammonium fluoride ($NH_4F$), potassium fluoride (KF), and sodium fluoride (NaF). In other embodiments, the buffer may be salts of weak acids that are included in the etching solution. Exemplary salts of weak acids that may be included in the etching solution according to embodiments disclosed herein are selected from salts of acetic acid, salts of oxalic acid, salts of carbonic acid, salts of phosphoric acid (e.g., phosphate salts), and salts of citric acid.

In embodiments, the etching solution may comprise HF as a primary etchant. One or more buffer may be added to the HF to increase the pH of the etching solution. In some embodiments the acid to buffer weight ratio may be from about 2:1 to about 0.5:1, such as from about 1.5:1 to about 1:1. In other embodiments, the acid to buffer weight ratio is about 1:1.

The glass composition can also affect the surface morphology of the glass substrate. As described hereinabove, when alumina is present in the glass substrate, the step of diffusing etchant to the glass surface is the limiting reaction in the etching process, which causes waviness and depressions in the surface of the glass substrate. In embodiments, a high-pH etching solution addresses this issue by shifting the limiting step of the etching process from the diffusion step to the reaction step by decreasing the amount of protons available to react with the alumina (i.e., Reaction 2). However, when the glass substrate does not comprise alumina, the limiting step in the etching process is the reaction step between silicate and the etchant (i.e., Reaction 1), which is a slow reaction compared to the reaction between alumina and the silicate. Therefore, for certain glass substrates that do not comprise alumina, the limiting step in the etching process is the reaction between the etchant and the silicate. Accordingly, when etching glass substrates that do not comprise alumina, the proton concentration of the etching solution is not as critical as when a glass substrate comprising alumina is being etched. Thus, in embodiments, the pH of an etching solution that will be used to etch glass substrates that do not comprise alumina does not need to be regulated as strictly. Accordingly, in embodiments, the glass substrate does not comprise alumina. Exemplary glasses that do not comprise alumina include soda-lime glass, and borosilicate glass. In addition to alumina, other components in the glass substrate, such as phosphate and phosphorous pentoxide ($P_2O_5$), may react quickly with protons in the etching solution. Accordingly, in embodiments, glass substrates do not include alumina, phosphate, or phosphorous pentoxide.

In addition to pH, the etch rate can also impact surface deformations of the glass substrate. Although not being bound by any particular theory, when the etching solution is present at the surface of the glass substrate, the glass is diffused and a byproduct of the dissolute glass is present at the surface of the glass substrate. This byproduct can interfere with the interface reaction between the etchant and the glass, thereby causing inconsistencies in the glass surface where the interference occurs. Accordingly, the higher the etch rate of the etching solution and the glass substrate, the more byproduct is produced that may interfere with the reaction between the etching solution and the glass substrate, and the longer it will take for the byproduct to diffuse into the bulk of the etching solution. Accordingly, in embodiments, the etching solution is selected to have an etch rate that allows the byproduct to diffuse into the bulk of the etching solution, which decreases the inconsistencies in the glass surface. In embodiments, the etch rate of the etching solution is less than about 3 μm/min, such as less than about 2.5 μm/min. In other embodiments, the etch rate of the etching solution is less than about 2 μm/min, such as less than about 1.5 μm/min. In embodiments, the etch rate is from about 0.5 μm/min to about 3 μm/min, such as from about 0.5 μm/min to about 2.5 μm/min. In other embodiments, the etch rate is from about 0.5 μm/min to about 2 μm/min, such as from about 0.5 μm/min to about 1.5 μm/min.

The etch rate of the etching solution may be controlled by modifying the composition of the etching solution. For example, in embodiments, weak acids may be used in combination with HF to lower the etch rate of the etching solution.

Temperature of the etchant solution may also impact the etch rate and quality of the glass substrate during the etching process. Higher etching solution temperatures generally increase the etch rate and, thus, higher etching solution temperatures may be used to decrease the duration of the etching process. Accordingly, in embodiments the temperature of the etching solution may be from about 10° C. to about 30° C., such from about 15° C. to about 25° C. In embodiments, it should be understood that higher or lower temperatures may be used.

In embodiments described herein above, the morphology of the surface is consistent. In some embodiments, a deviation in the thickness of the glass substrate or a depression surrounding a hole or through-feature is present. The deviation or depression described above is illustrated in FIG. 7A which shows a glass substrate 700 having a first surface 702 and a second surface 704 opposing first surface 702. Glass substrate 700 has at least one through-feature 706 extending from first surface 702 to second surface 704. In some embodiments, glass substrate 700 has a deviation in thickness or depression 708 surrounding through-feature 706 on first surface 702. A first plane 710 is shown that contacts first surface 702 in regions that do not have a depression 708 or a through-feature 706. The deviation or depression 708 may have a surface 712 recessed from first plane 710 by a distance d1. Surface 712 ends at a sidewall 713 of through-feature 706. Distance d1 is measured as the greatest distance between first plane 710 and surface 712 of the depression. In some embodiments, not shown, there may be a plurality of through-features 706 and some or all have a deviation or depression 708 at the first surface. In some embodiments, not shown, the may also be a deviation or depression 708 at the second surface of some or all of through-features 706 wherein the depressions in the second surface 704 have a surface recessed from a second plane by a distance d2. The second plane is a plane that contacts second surface 704 in regions that do not have a depression or through-feature. Distance d1 is measured as the greatest distance between the second plane and the surface of the depression. In some embodiments, a through-feature 706 may have a depression on the first surface and the second surface and the distance d1 may be the same as, or different from, the distance d2. In some embodiments, as shown for example in FIG. 7B if through features 706 are spaced close enough together, a single depression 708' may merge together to surround through-features 706. In some embodiments, the distance a depression 708' surrounds adjacent through-features 706 if the through-features are spaced apart about 200 μm or less.

In some embodiments, the distance d1 or d2 is less than or equal to about 0.2 μm, less than or equal to about 0.15 μm, less than or equal to about 0.1 μm, or less than or equal to about 0.05 μm, in a range from about 0.01 μm to about 0.2 μm in a range from about 0.01 μm to about 0.15 μm, in a range from about 0.05 μm to about 0.2 μm, in a range from about 0.05 μm to about 0.15 μm, in a range from about 0.1 μm to about 0.2 μm or in a range from about 0.1 μm to about 0.15 μm. The distances d1 and d2 can be measured with an optical surface profilometer, such as the NewView 7300 available from Zygo Corporation. The distances d1 and d2 specified above are able to be achieved as a result of the etching techniques disclosed above.

In some embodiments, the above deviations or depression may be achieved when the hole or through-feature has a diameter at a first or second surface of the substrate as measured by an optical microscope is greater than or equal to about 5 μm, greater than or equal to about 10 μm, greater than or equal to about 15 μm, greater than or equal to about 20 μm, greater than or equal to about 25 μm, greater than or equal to about 30 μm, greater than or equal to about 35 μm, greater than or equal to about 40 μm, greater than or equal to about 45 μm, or greater than or equal to about 50 μm.

Figure 7A:
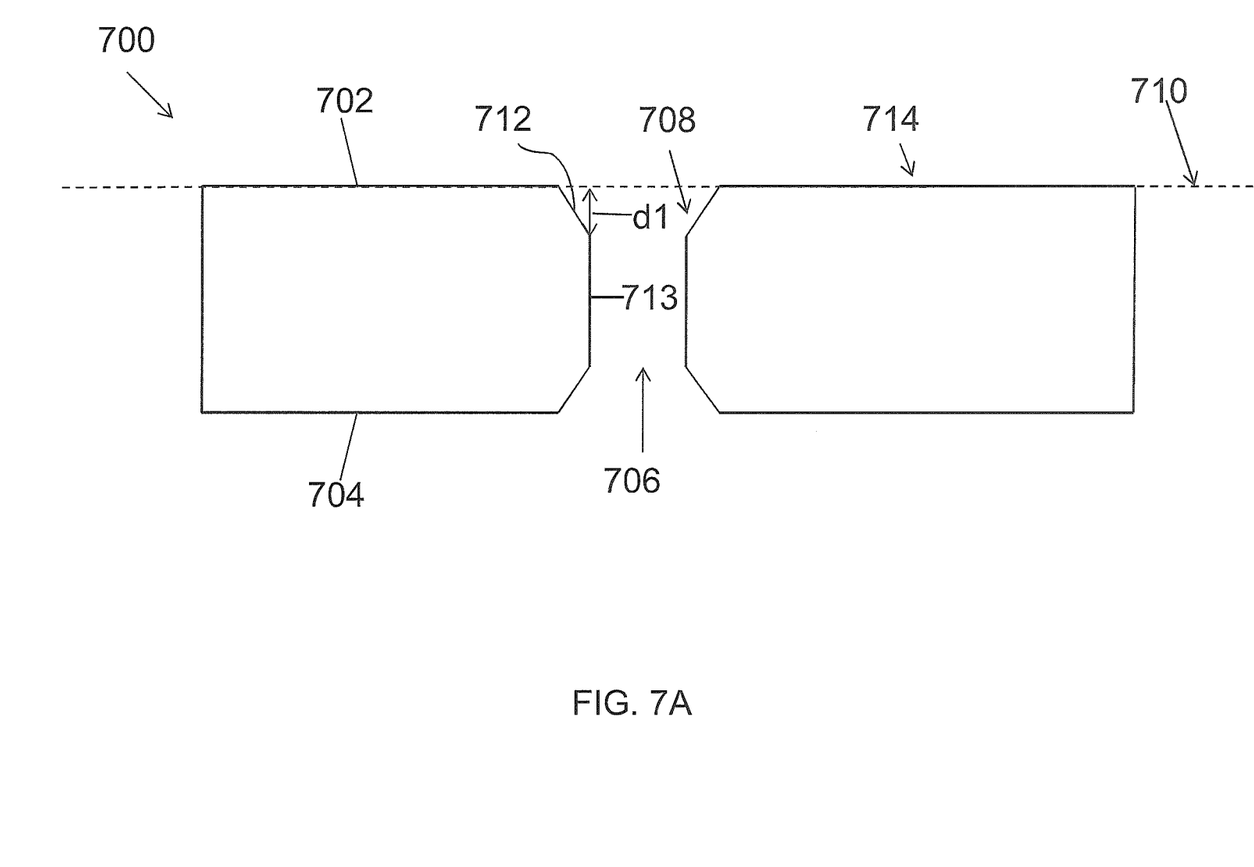
FIG. 7A is an exemplary cross-sectional view of a glass substrate with a through-feature having a depression.
Figure 7B:
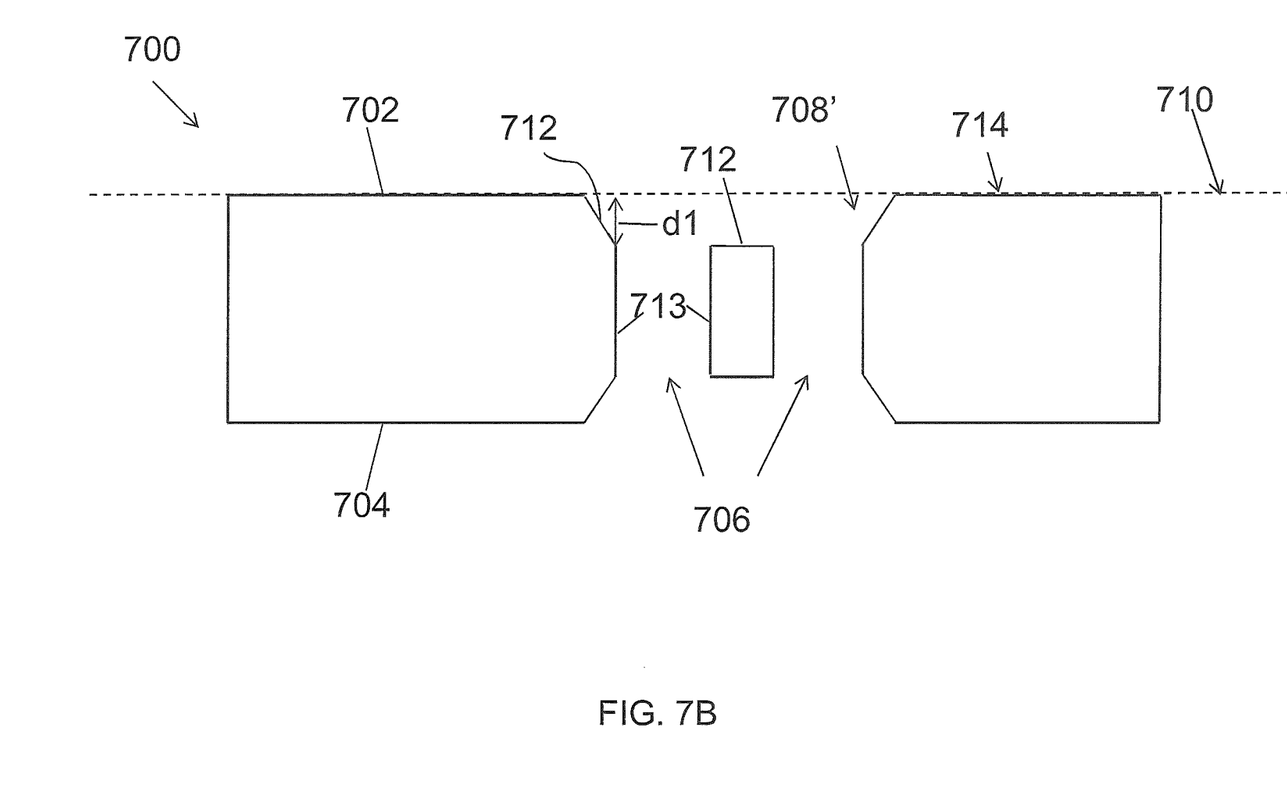
FIG. 7B is an exemplary cross-sectional view of a glass substrate with two through-feature sharing a depression.

In some embodiments, regions 714 of first surface 702 and second surface 704 that are not part of a depression have an average surface roughness $R_a$ of less than or equal to 0.9 nm, less than or equal to 0.8 nm, less than or equal to 0.7 nm, less than or equal to 0.6 nm, less than or equal to 0.5 nm, less than or equal to 0.4 nm. In some embodiments the average surface roughness of regions 714 is in a range from about 0.4 nm to about 0.9 nm, from about 0.4 nm to about 0.8 nm, about 0.4 nm to about 0.7 nm, about 0.5 nm to about 0.9 nm, about 0.5 nm to about 0.8 nm, or about 0.5 nm to about 0.7 nm. In some embodiments, first surface 702 or second surface 704 as at least one region 714 with an area of 2 μm by 2 μm, at least two regions 714 with an area of 2 μm by 2 μm, at least three regions 714 with an area of 2 μm by 2 μm, at least four regions 714 with an area of 2 μm by 2 μm, at least five regions 714 with an area of 2 μm by 2 μm, at least six regions 714 with an area of 2 μm by 2 μm, at least seven regions 714 with an area of 2 μm by 2 μm, at least eight regions 714 with an area of 2 μm by 2 μm, at least nine regions 714 with an area of 2 μm by 2 μm, or at least ten regions 714 with an area of 2 μm by 2 μm have an average surface roughness $R_a$ in the ranges listed above. The average surface roughness $R_a$ is able to be achieved using the etching techniques disclosed above. As used herein the average surface roughness $R_a$ is measured over a 2 μm by 2 μm sized area and defined as the arithmetic average of the differences between the local surface heights and the average surface height and can be described by the following equation:

$$R_a = \frac{1}{n}\sum_{i=1}^{n}|y_i|$$

where $y_i$ is the local surface height relative to the average surface height. The average surface roughness $R_a$ can be measured using an atomic force microscope (AFM), for example the Dimension Icon available from Veeco.

In some embodiments, the glass substrates are strengthened by a strengthening process. In some embodiments, the strengthening process may occur before the pilot holes have been formed in the glass substrate. In other embodiments, the strengthening process may occur after the pilot holes have been formed in the glass substrate the glass substrate. The glass substrates may be chemically strengthened by an ion exchange process in which ions in the surface layer of the glass are replaced by larger ions having the same valence or oxidation state. In one particular embodiment, the ions in the surface layer and the larger ions are monovalent alkali metal cations, such as Li$^+$ (when present in the glass), Na$^+$, K$^+$, Rb$^+$, and Cs$^+$. Alternatively, monovalent cations in the surface layer may be replaced with monovalent cations other than alkali metal cations, such as Ag$^+$, Tl$^+$, Cu$^+$, or the like.

The ion-exchange process creates a compressive stress at the surfaces of the glass substrate. These compressive stresses extend beneath the surface of the glass substrate to a certain depth, referred to as the depth of layer. The compressive stresses are balanced by a layer of tensile stresses (referred to as central tension) such that the net stress in the glass substrate is zero. The formation of compressive stresses at the surface of the shaped glass substrate makes the glass strong and resistant to mechanical damage.

In one embodiment, the glass substrate is chemically strengthened by ion-exchange in which smaller sodium ions near the surface of the glass are exchanged with larger potassium ions when the glass substrate is placed in an ion exchange bath. In embodiments, the ion exchange bath comprises molten KNO$_3$, NaNO$_3$, or mixtures thereof. Replacement of the smaller sodium ions with the larger potassium ions causes a layer of compressive stress to develop in the surfaces of the glass substrate. The compressive stress extends below the surfaces of the glass substrate to a specified depth of layer (compressive surface layer). A compressive surface layer extends from the upper surface and the underside surface to the depth of layer. The compressive surface layer is balanced by the development of the internal tension layer at the center of the glass substrate.

In the embodiments described herein, the compressive stress and depth of layer developed in the shaped glass substrate by strengthening are sufficient to improve the damage tolerance of the shaped glass substrate while also facilitating further processing (such as by edge finishing) without risk of introducing flaws into the shaped glass substrate. In one embodiment, the compressive stress may be from about 200 MPa to about 1000 MPa. In another embodiment, the compressive stress may be from about 500 MPa to about 800 MPa. In yet another embodiment, the compressive stress may be from about 650 MPa to about 900 MPa. In one embodiment, the depth of layer may be from about 10 microns to about 80 microns. In another embodiment, the depth of layer may be from about 30 microns to about 60 microns. In yet another embodiment, the depth of layer may be from about 40 microns to about 60 microns.

In some embodiments, the glass substrate is strengthened after the laser damage and etching steps. However, in other embodiments the glass substrate may be strengthened before the laser damage and etching step.

In some embodiments, a semiconductor device can include the glass substrates described herein having at least one through-hole with a deviation in thickness at a depression in the amount disclosed herein and/or an average surface roughness R$_a$ in an amount disclosed herein.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Further, the term "exemplary" may be utilized herein to represent non-limiting examples according to embodiments.

EXAMPLES

Embodiments will be further clarified by the following examples.

Example 1

Figure 4:
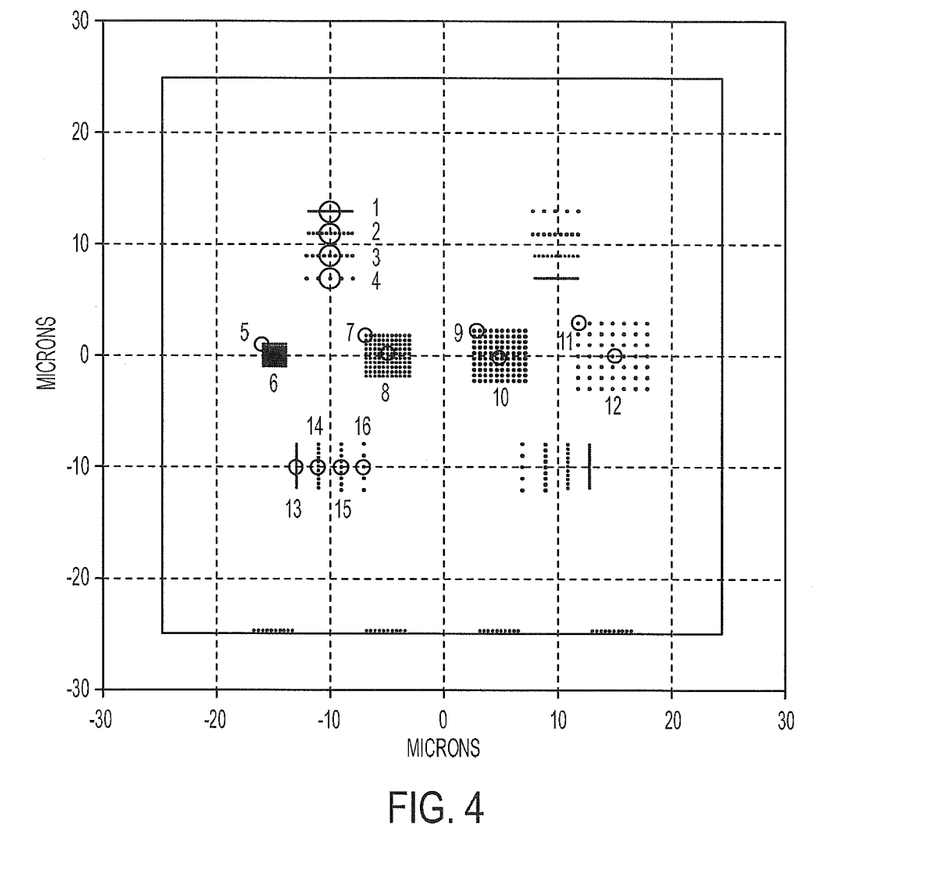
FIG. 4 is a grid showing the location of pilot holes in an exemplary glass substrate according to one or more embodiments described and illustrated herein.

Eagle XG glass (an aluminosilicate glass) manufactured by Corning was formed into 50 mm by 50 mm substrates having a thickness of 0.2 mm. Pilot holes were then formed by percussion drilling using a 355 nm nanosecond laser operating at a 5 kHz repetition rate. The pilot holes were formed in the glass substrate as shown in FIG. 4. As can be seen in FIG. 4, the pilot holes were formed in various geometries, including lines and squares with pitches of 100 µm, 200 µm, 500 µm, and 1000 µm. The pilot holes had a top diameter of 15 µm and a bottom diameter of about 3 µm.

Some glass substrates were placed in a high-pH etching solution and other glass substrates were placed in a low-pH etching solution. Each of the high-pH etching solution and the low-pH etching solution were provided in a Crest ultrasonic tank and the etching was conducted with 40 kHz ultrasonic agitation.

The low-pH etching solution was made with 3M HF and 2.4M HNO$_3$ and had a pH of about −0.4. The high-pH etching solution was made with 3M HF and 1M NH$_4$F and had a pH of about 1.4. For each of the high-pH etching solution and the low-pH etching solution, the through-features were formed to have diameters of 20 µm, 50 µm, and 90 µm. The surface morphology of the through-feature and the area around the through feature at the 16 locations indicated in FIG. 4 were evaluated by an interferometer manufactured by Zygo.

Figure 5A:
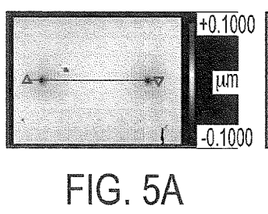
Figure 5B:
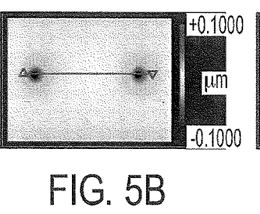
Figure 5C:
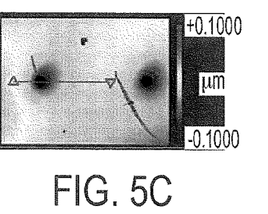
Figure 5D:
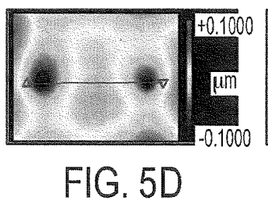
Figure 5E:
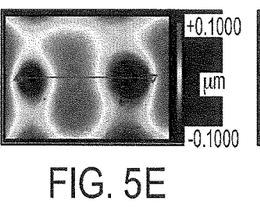

FIGS. 5A-C show images of the surface morphology at location 12 of FIG. 4 for the etching conducted with the high-pH etching solution, and FIGS. 5D-F show images of the surface morphology at location 12 of FIG. 4 for the etching conducted with the low-pH etching solution. Particularly, FIG. 5A is an image of the surface morphology of 20 µm diameter through-hole etched by a high-pH etching solution; FIG. 5B is an image of the surface morphology of 50 µm diameter through-hole etched by a high-pH etching solution; and FIG. 5C is an image of the surface morphology of 90 µm diameter through-hole etched by a high-pH etching solution. FIG. 5D is an image of the surface morphology of 20 µm diameter through-hole etched by a low-pH etching solution; FIG. 5E is an image of the surface morphology of 50 µm diameter through-hole etched by a low-pH etching solution; and FIG. 5F is an image of the surface morphology of 90 µm diameter through-hole etched by a low-pH etching solution. As can be seen in a comparison of FIGS. 5A-F surface waviness and depressions around the through-feature are dramatically decreased when using the high-pH etching solution for through-features with any diameter.

Figure 6:
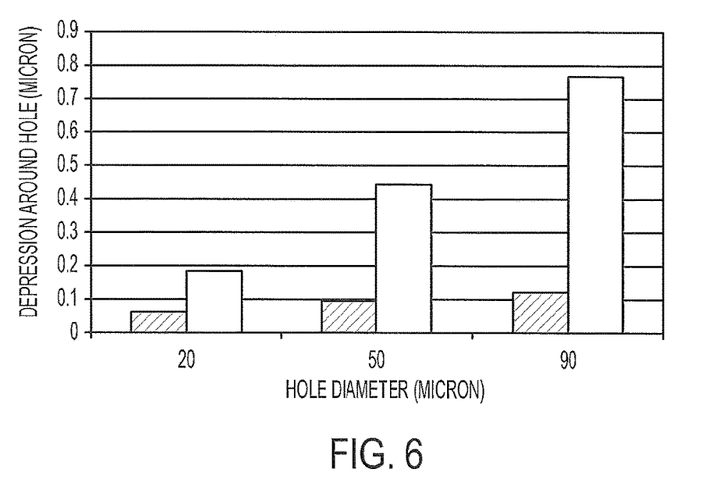
FIG. 6 graphically depicts the depths of depressions around through-features in glass substrates using a high-pH etching solution and a low-pH etching solution according to one or more embodiments described and illustrated herein.

FIG. 6 graphically shows the depth of the depressions (relative to the glass surface) around the through-holes. As shown in FIG. 6 the high-pH etching solution results in a depression having a depth of about 0.05 µm around the through-feature having a 20 µm diameter, a depression having a depth of about 0.1 µm around the through-feature having a 50 µm diameter, and a depression having a depth of about 0.12 µm around the through-feature having a 90 µm diameter. In comparison, the low-pH etching solution results in a depression having a depth of about 0.18 µm around the through-feature having a 20 µm diameter, a depression having a depth of about 0.45 µm around the through-feature having a 50 µm diameter, and a depression having a depth of about 0.75 μm around the through-feature having a 90 μm diameter. The depths were measured using the NewView 7300 optical surface profilometer available from Zygo Corporation. The diameters were measured at the surface and measured using an optical microscope.

This example clearly shows that for an aluminosilicate glass, using an etching solution having a high pH can, in embodiments, reduce the depth of depressions around through features formed by percussion drilling. In embodiments, the depth of depressions around through-features using a high-pH etching solution is from about one third to about one seventh of the depth of depressions around a through-feature using a low-pH etching solution.

Example 2

Eagle XG glass (an aluminosilicate glass) manufactured by Corning was formed into 50 mm by 50 mm substrates having a thickness of 0.7 mm. Pilot holes were then formed by percussion drilling using a 355 nm nanosecond laser operating at a 5 kHz repetition rate. The pilot holes had a top diameter of about 15 μm and a bottom diameter of about 8 μm.

Glass substrates were placed in an etching solution of various pH. Each etching solution was provided in a Crest ultrasonic tank and the etching was conducted with 80 kHz ultrasonic agitation. Table 1 below details the contents of each etching solution, the estimated pH, the etching rate, and the average surface roughness $R_a$ of the surface in 2 μm by 2 μm region where there are no depressions. The pH was estimated by using the method taught in Kolasinski, Kurt W. "The Composition of Fluoride Solutions", Journal of the Electrochemical Society, 152 (9) J99-J104 (2005). The etch rate was measured by measuring the thickness of the glass before and after etching. The surface roughness Ra was measured by over a 2 μm by 2 μm area of the top surface using the Dimension Icon atomic force microscope (AFM) available from Veeco.

TABLE 1

| Solution | Concentration | Etch Rate (um/min) | estimated pH | Ra (nm) |
|---|---|---|---|---|
| 1 | 1M HF | 0.22 | 1.60 | 1.11 |
| 2 | 3M HF | 0.73 | 1.36 | 1.06 |
| 3 | 6M HF | 1.58 | 1.21 | 0.945 |
| 4 | 1M HF-1.6M HNO3 | 0.49 | −0.20 | 1.08 |
| 5 | 3M HF-1.6M HNO3 | 1.24 | −0.20 | 1.06 |
| 6 | 6M HF-1.6M HNO3 | 2.50 | −0.20 | 1.03 |
| 7 | 1M HF-1M NH4F | 0.23 | 3.52 | 0.73 |
| 8 | 3M HF-1M NH4F | 0.72 | 1.60 | 0.828 |
| 9 | 6M HF-1M NH4F | 1.37 | 1.25 | 0.863 |

Figure 8:
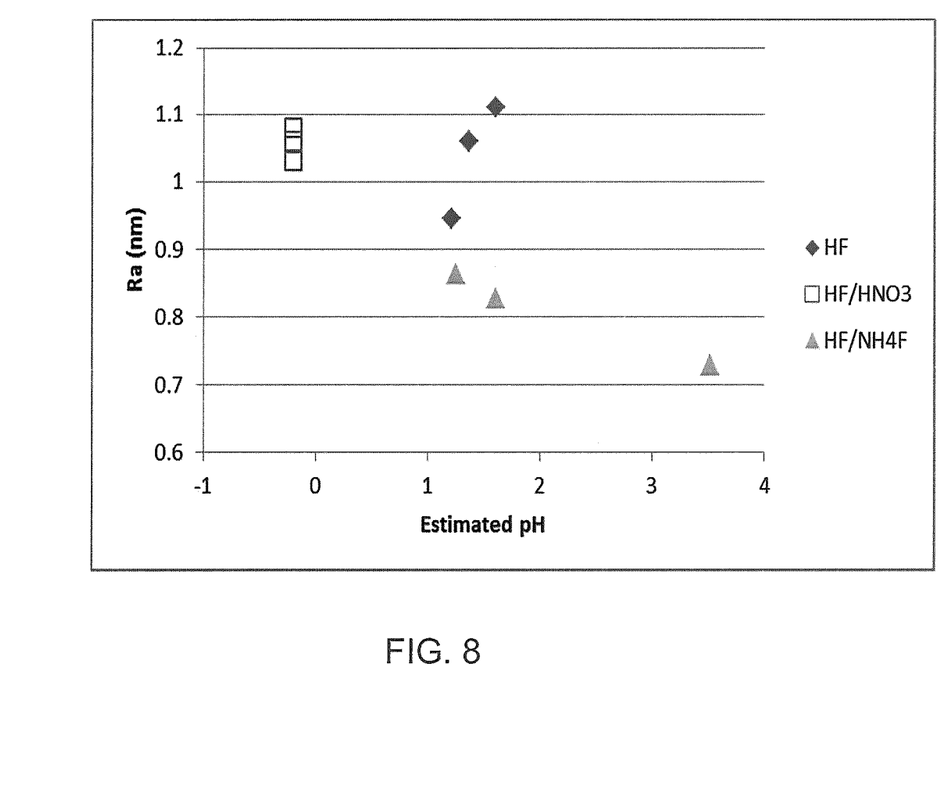
FIG. 8 plots the results of Example 2 with the pH on the x axis and the surface roughness $R_a$ (nm) on the y axis.

FIG. 8 plots the Ra and pH of each sample with the pH on the x axis and the Ra (nm) on the y axis. As can be seen the lowest Ra values were achieved using an etching solution having a combination of HF acid and NH₄F buffer.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A glass substrate comprising:
a first surface and a second surface opposite the first surface in a thickness direction; and
at least one through-feature penetrating the first surface and extending to and penetrating the second surface, wherein the through-feature comprises a first depression around the through-feature at the first surface, a second depression around the through-feature at the second surface, and a sidewall, wherein
a first depression extends from a first plane, which contacts and is parallel to the first surface, to the sidewall, with which the first plane is substantially perpendicular; and
a second depression extends from a second plane, which contacts and is parallel to the second surface, to the sidewall, with which the second plane is substantially perpendicular, wherein each distance from the respective plane to an intersection of the sidewall and the respective depression is greater than or equal to 0.01 μm to less than or equal to 0.2 μm.

2. The glass substrate of claim 1, wherein the at least one through-feature is etched by an etching solution.

3. The glass substrate of claim 1, wherein the first and/or second distance between the respective plane and the intersection of the sidewall and the respective depression is less than or equal to 0.15 μm.

4. The glass substrate of claim 1, wherein at least one 2 μm by 2 μm region of the first surface without the through-feature has an average surface roughness $R_a$ less than about 0.9 nm.

5. The glass substrate of claim 1, wherein at least five 2 μm by 2 μm regions of the first surface without the through-feature have an average surface roughness $R_a$ less than about 0.9 nm.

6. The glass substrate of claim 1, wherein a diameter the first and/or second depression is greater than or equal to 5 μm.

7. A semiconductor device comprising the glass substrate of claim 1.

8. A glass substrate comprising:
a first surface and a second surface opposite the first surface in a thickness direction; and
at least one through-feature penetrating the first surface and extending to and penetrating the second surface, wherein the through-feature comprises a first depression around the through-feature at the first surface, a second depression around the through-feature at the second surface, and a sidewall, wherein
a depression extends from a plane, which contacts and is parallel to the first surface, to the sidewall, with which the plane is substantially perpendicular;
the through-feature formed by contacting the glass substrate having a pilot hole with an etching solution and enlarging the diameter of the pilot hole by agitating at least one of the glass substrate or the etching solution; and
a distance from the plane to an intersection of the sidewall and the depression is greater than or equal to 0.01 μm to less than or equal to 0.2 μm.

9. The glass substrate of claim 8, wherein the distance between the plane and an intersection of the sidewall and the depression is less than or equal to 0.15 μm.

10. The glass substrate of claim 8, wherein at least one 2 μm by 2 μm region of the first surface without the through-feature has an average surface roughness $R_a$ less than about 0.9 nm.

11. The glass substrate of claim 8, wherein at least five 2 μm by 2 μm regions of the first surface without the through-feature have an average surface roughness $R_a$ less than about 0.9 nm.

12. The glass substrate of claim 8, wherein:
the at least one through-feature comprises a second depression that extends from a second plane, which contacts and is parallel to the second surface, to the sidewall; and
a distance from the second plane to an intersection of the sidewall and the second depression is less than or equal to 0.2 μm.

13. The glass substrate of claim 12, wherein at least one 2 μm by 2 μm region of the first surface without the through-feature has an average surface roughness $R_a$ less than about 0.9 nm.

14. The glass substrate of claim 8, wherein a diameter of the depression is greater than or equal to 5 μm.

15. A semiconductor device comprising the glass substrate of claim 8.

\* \* \* \* \*